United States Patent
Kettinger et al.

(10) Patent No.: US 12,313,717 B2
(45) Date of Patent: May 27, 2025

(54) AVOIDANCE OF ARTIFACTS IN MEASUREMENT DATA CAPTURED USING A MAGNETIC RESONANCE SYSTEM

(71) Applicant: Siemens Healthineers AG, Forchheim (DE)

(72) Inventors: Adam Kettinger, Erlangen (DE); Flavio Carinci, Würzburg (DE); Miriam Van De Stadt-Lagemaat, Erlangen (DE); Mario Zeller, Erlangen (DE); Dominik Paul, Bubenreuth (DE)

(73) Assignee: Siemens Healthineers AG, Forchheim (DE)

( * ) Notice: Subject to any disclaimer, the term of this patent is extended or adjusted under 35 U.S.C. 154(b) by 210 days.

(21) Appl. No.: 18/091,650

(22) Filed: Dec. 30, 2022

(65) Prior Publication Data

US 2023/0213603 A1 Jul. 6, 2023

(30) Foreign Application Priority Data

Dec. 30, 2021 (DE) .......................... 102021215104.3
Jan. 11, 2022 (DE) .......................... 102022200185.0

(51) Int. Cl.
*G01V 3/00* (2006.01)
*G01R 33/54* (2006.01)
(Continued)

(52) U.S. Cl.
CPC ....... *G01R 33/5617* (2013.01); *G01R 33/543* (2013.01); *G01R 33/56518* (2013.01); *G01R 33/56554* (2013.01)

(58) Field of Classification Search
CPC .............. G01R 33/5617; G01R 33/543; G01R 33/56518; G01R 33/56554
(Continued)

(56) References Cited

U.S. PATENT DOCUMENTS

| 6,160,397 A * | 12/2000 | Washburn ........ G01R 33/56554 324/309 |
| 2015/0177354 A1* | 6/2015 | Bachschmidt ... G01R 33/56536 324/309 |

(Continued)

FOREIGN PATENT DOCUMENTS

| CN | 106821500 A * | 6/2017 | |
| CN | 108378848 A * | 8/2018 | ........... A61B 5/0488 |
| WO | WO-03052445 A1 * | 6/2003 | ......... G01R 33/5615 |

OTHER PUBLICATIONS

Kronthaler, Sophia et al.: "Trajectory Correction Based On The Gradient Impulse Response Function Improves High-Resolution Ute Imaging Of The Musculoskeletal System"; Magnetic Resonance in Medicine; 2021.
(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

A method for avoiding artifacts in measurement data captured using a magnetic resonance system which has a gradient unit. The method includes loading data which characterizes the gradient unit of the magnetic resonance system; loading a measurement protocol to be used for capturing the measurement data, wherein the measurement protocol includes gradients to be switched and RF excitation pulses and RF refocusing pulses to be irradiated, wherein, after irradiation of an RF excitation pulse, a train of at least two RF refocusing pulses is irradiated and measurement data is captured after each RF refocusing pulse; determining compensation gradients which, after the capture of the measurement data, are to be switched after a final RF refocusing pulse of the train of RF refocusing pulses associated with the RF excitation pulse and before a following RF excitation pulse as a function of the loaded measurement
(Continued)

protocol and of the data which characterizes the gradient unit; and carrying out the measurement protocol using the determined compensation gradients.

15 Claims, 3 Drawing Sheets

(51) Int. Cl.
*G01R 33/561* (2006.01)
*G01R 33/565* (2006.01)

(58) Field of Classification Search
USPC .......................................................... 324/307
See application file for complete search history.

(56) References Cited

U.S. PATENT DOCUMENTS

2018/0136298 A1    5/2018  Wilm et al.
2019/0377044 A1*  12/2019  Rahmer ............. G01R 33/4808

OTHER PUBLICATIONS

Vannesjo, Signe J. et al. "Gradient System Characterization by Impulse Response Measurements with a Dynamic Field Camera" Magnetic Resonance in Medicine, vol. 69, pp. 583-593, (2013).

* cited by examiner

AVOIDANCE OF ARTIFACTS IN MEASUREMENT DATA CAPTURED USING A MAGNETIC RESONANCE SYSTEM

TECHNICAL FIELD

The disclosure relates to a method for avoiding artifacts in measurement data captured using a magnetic resonance system, as well as to an associated magnetic resonance system, a computer program and an electronically readable data storage medium.

BACKGROUND

Magnetic resonance technology (the abbreviation MR hereinafter denotes magnetic resonance) is a known technology with which images of the interior of an object under examination can be produced. In simple terms, the object under examination is to this end positioned in a magnetic resonance device in a comparatively strong static, homogeneous main magnetic field, also known as $B_0$ field, with field strengths of 0.2 tesla to 7 tesla and higher, such that the nuclear spins thereof are oriented along the main magnetic field. In order to trigger nuclear spin resonances which are measurable as signals, radio-frequency excitation pulses (RF pulses) are irradiated into the object under examination, the triggered nuclear spin resonances are measured as "k-space data" and used as the basis for reconstructing MR images or ascertaining spectroscopic data. Rapidly switched magnetic gradient fields, or gradients for short, are overlaid on the main magnetic field in order to spatially encode the measurement data. An applied scheme which describes a time sequence of RF pulses to be irradiated and gradients to be switched is known as a pulse sequence (scheme), or also sequence for short. The recorded measurement data is digitized and saved as complex numerical values in a k-space matrix. On the basis of the k-space matrix populated with values, it is possible to reconstruct an associated MR image, for example using a multidimensional Fourier transform.

Probably the most widely used method for generating echo signals after excitation of the nuclear spins is the "spin echo method". In the simplest case, this involves as it were "flipping" the transverse magnetization by irradiating at least one RF refocusing pulse after irradiation of the RF excitation pulse, whereby the dephased magnetization comes back into phase, thus producing a "spin-echo" SE after a time TE, known as the echo time, after the RF excitation pulse.

Excitation and measurement of the produced echo signals are repeated (for example switching between different gradients for spatial encoding) after a repeat time TR until the desired number of echo signals have been measured and stored in the k-space in order to be able to image the object under examination.

SE sequences which are in widespread clinical use include in particular the "Turbo Spin-Echo" (TSE) sequences which are also known by the names "Fast Spin-Echo" (FSE) or "Rapid Acquisition with Refocused Echoes" (RARE) sequences. The advantage of TSE sequences over the "simple" SE sequence is that a plurality of refocusing pulses are switched after an RF excitation pulse and that consequently a plurality of spin-echo signals SE can also be produced after one excitation. This accelerates data capture, since fewer repeats of the sequence with different spatial encoding are required to measure all the desired data. TSE sequences thus reduce the measurement time for the entire k-space relative to conventional SE methods in accordance with the number of echo signals refocused and captured after an excitation, this number being known as the "turbo factor".

However, the inherent feature of TSE sequences of making use of the same transverse magnetization for capturing a plurality of lines in the k-space also results in TSE being more sensitive than a simple SE-sequence to imperfections in the imaging process, inter alia also to eddy currents and instabilities in sequence timing.

A sensitivity of TSE sequences to eddy current effects is frequently increased by a usually periodic design of slice selection and read-out gradient shapes, the same gradient shape often being used for each read-out process after refocusing. By the end of a train of RF refocusing pulses, eddy current effects of these gradients may therefore accumulate considerably and have a negative impact on the subsequent excitation and capture of measurement data. This may result in unwanted artifacts, for example "shading", signal loss and, for example when using (fat) saturation pulses, reduced saturation.

SUMMARY

An object of the present disclosure is to enable capture of measurement data using a magnetic resonance system in which artifacts, in particular artifacts caused by eddy currents, are avoided.

The object is achieved by a method for avoiding artifacts in measurement data captured using a magnetic resonance system as claimed in claim 1, a magnetic resonance system as claimed in claim 13, a computer program as claimed in claim 14, and an electronically readable data storage medium as claimed in claim 15.

A method according to the disclosure for avoiding artifacts in measurement data captured using a magnetic resonance system which comprises a gradient unit comprises the steps of:

loading data which characterizes the gradient unit of the magnetic resonance system, loading a measurement protocol to be used for capturing the measurement data, which protocol comprises gradients to be switched and RF excitation pulses and RF refocusing pulses to be irradiated, wherein, after irradiation of an RF excitation pulse, a train of at least two RF refocusing pulses is irradiated and measurement data is captured after each RF refocusing pulse, and determining compensation gradients which, after capture of measurement data, are to be switched after a final RF refocusing pulse of a train of RF refocusing pulses associated with an RF excitation pulse and before a following RF excitation pulse as a function of the loaded measurement protocol and of the data which characterizes the gradient unit, carrying out the loaded measurement protocol using the determined compensation gradients.

The present disclosure is based on the recognition that perturbing eddy current effects, their occurrence and also their impact on imaging in magnetic resonance technology are highly dependent on the magnetic resonance system, in particular on the gradient unit, which is used. Just small differences during the manufacture of the gradient unit and the gradient coils it comprises and other hardware components in the magnetic resonance system modify the eddy current behavior of the magnetic resonance system.

Previous approaches to eddy current compensation disregard such system-specific interrelationships and at best concentrate on aspects of the gradients to be switched in the measurement protocol, with rigidly predetermined and inflexible compensation gradients, which are usually limited to gradients in the read-out direction and/or slice selection direction.

Thanks to compensation gradients being determined according to the disclosure as a function not only of a loaded measurement protocol which is to be used but also of the data which characterizes the gradient unit of the used magnetic resonance system which is to be used, it is possible to achieve a both protocol-specific and system-specific reduction in perturbing effects, which overall considerably increases the image quality to be achieved from image data reconstructed from measurement data captured in this manner.

The data which characterizes the gradient unit may here characterize an eddy current characteristic of the gradient unit. Unwanted effects brought about by eddy currents may be purposefully reduced as a consequence.

For example, the data which characterizes the gradient unit may be based on measured gradient impulse response functions (GIRFs). These are interactions between the individual gradient fields produced by the gradient coils. In other words, GIRFs describe the effect of the gradient axes on one another, if for example a gradient produced on a first axis affects the gradient curve of at least one further axis, which contributes to deviations between planned gradients and those actually played out. The causes of this reside, for example, in the coil geometry by which the gradient coils influence one another inductively, and the electronic signal paths.

In order to obtain information about the behavior of gradient units, methods for determining these GIRFs have been developed. For example, the article by Signe Johanna Vannesjö et al. "Gradient System Characterization by Impulse Response Measurements with a Dynamic Field Camera", Magnetic Resonance in Medicine 69, 2013, pp. 583-593 describes a method for capturing GIRFs with the assistance of field cameras.

On installation of a magnetic resonance system, GIRFs may, for example, be measured for each physical axis X, Y, and Z of the gradient unit of the magnetic resonance system. One-off measurement of the GIRFs of the gradient unit of the magnetic resonance system should be sufficient. It is, however, also conceivable to remeasure the GIRFs of the gradient unit of the magnetic resonance system, for example in the event of gradient unit-related changes to the magnetic resonance system.

On the basis of a known GIRF of a gradient unit and of a nominal, planned gradient (in its time profile), it is possible by convolving for each axis the corresponding GIRF with the associated nominal, planned gradient to determine the gradient actually achieved by the gradient unit, in which any eddy current effects are taken into account. This may generally be expressed by:

$$G^{actual}(t) = G^{nominal}(t) \leq \text{GIRF}(t). \quad (1)$$

The data which characterizes the gradient unit may also be determined on the basis of a model which comprises measured decay profiles of the gradient unit. In particular, a gradient unit's eddy current behavior may be expressed by a weighted total of exponential decay profiles of the gradient unit's gradient coils as:

$$\Sigma_k a_k e^{-t/\tau_k} \quad (2)$$

Amplitudes $a_k$ and time constants $\tau_k$ of the decay profiles of the gradient unit of a magnetic resonance system may, for example, be measured once during installation of the magnetic resonance system. It is, again, also conceivable to remeasure such decay profiles of the gradient unit, for example in the event of a gradient unit-related change to the magnetic resonance system.

On the basis of such data which characterizes the gradient unit as a weighted sum of measured decay profiles, it is possible to calculate the arising eddy currents E(t) by convolving the first time derivative of a nominal, planned gradient with the data which characterizes the gradient unit:

$$E(t) = \left(\frac{d}{dt} G^{nominal}(t)\right) \otimes \sum_k a_k e^{-t/\tau_k} \quad (3)$$

A magnetic resonance system according to the disclosure comprises a magnet unit, a gradient unit, a radio-frequency unit and a control device configured to carry out a method according to the disclosure and having a compensation gradient determination unit.

A computer program according to the disclosure implements a method according to the disclosure on a control device when it is executed on the control device.

The computer program may here also take the form of a computer program product which is directly loadable into a memory of a control device, having program code-means for carrying out a method according to the disclosure when the computer program product is executed in the computing unit of the computer system.

An electronically readable data storage medium according to the disclosure comprises electronically readable control information stored thereon which comprises at least one computer program according to the disclosure and is designed such that, when the data storage medium is used in a control device of a magnetic resonance system, it carries out a method according to the disclosure.

The advantages and explanations stated in relation to the method also apply analogously to the magnetic resonance system, the computer program product and the electronically readable data storage medium.

BRIEF DESCRIPTION OF THE DRAWINGS

Further advantages and details of the present disclosure are revealed by the exemplary aspects described below and with reference to the drawings. The stated examples do not limit the disclosure. In the figures.

DETAILED DESCRIPTION

Figure 1:
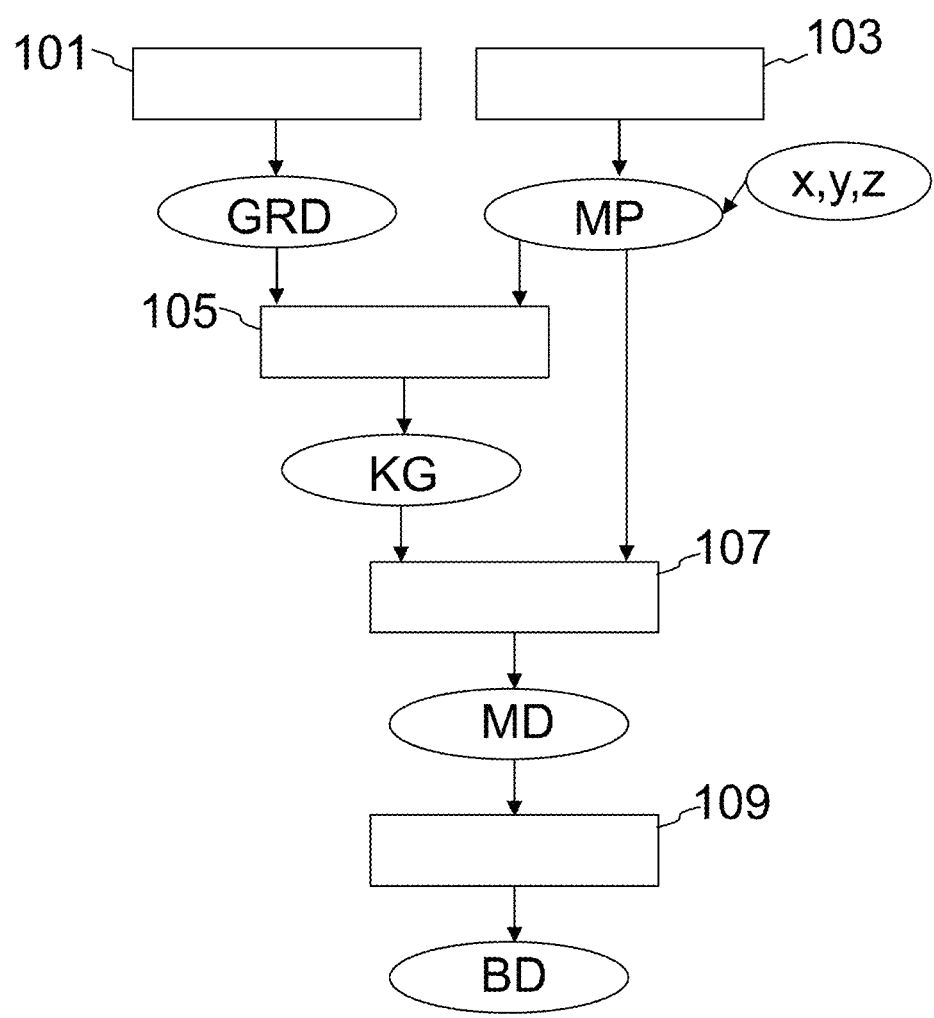
FIG. 1 shows a schematic sequence diagram of a method according to the disclosure.

FIG. 1 is a schematic sequence diagram of a method according to the disclosure for avoiding artifacts in measurement data captured using a magnetic resonance system which comprises a gradient unit.

Data GRD which characterizes the gradient unit of the magnetic resonance system is loaded (block 101).

If the gradient unit comprises at least two, in particular three, gradient coils, the data which describe the gradient unit may be loaded for each of the coils which the gradient unit comprises, wherein each gradient coil of the gradient unit acts in one axis of the physical coordinate system (X,Y,Z).

In particular, the data which characterizes the gradient unit characterizes an eddy current characteristic of the gradient unit.

The data which characterizes the gradient unit may, as has already been mentioned above, be based on measured gradient impulse response functions (GIRFs).

The gradient impulse response functions on which the data which characterizes the gradient unit is based may have been measured on the magnetic resonance system for a series of frequencies, in particular for low frequencies, for example frequencies located within the half-value width of the spectral density-frequency diagram, for example for frequencies of less than 10 kHz. Such a measurement of the GIRFs also for long time constants with a correspondingly low frequency means that long-term eddy currents can also still be effectively described or predicted by convolution according to (1).

The data which characterizes the gradient unit may, as has already been mentioned above, alternatively be determined on the basis of a model which comprises measured decay profiles of the gradient unit.

A measurement protocol MP to be used for capturing the measurement data MD, which protocol comprises gradients to be switched and RF excitation pulses and RF refocusing pulses to be irradiated, is loaded (block 103). Spatial encoding during capture of the measurement data is carried out in a logical coordinate system (x,y,z), wherein for example the z direction corresponds to the slice selection direction, the y direction to the phase-encoding direction and the x direction to the read-out direction. The logical coordinate system is here selected in accordance with the location and position of a test report of an object under examination from which measurement data is to be captured. The logical coordinate system (x,y,z) therefore generally does not correspond to the physical coordinate system (X,Y,Z) in which the magnetic resonance system is oriented. A selected logical coordinate system (x,y,z) also depends on the location and position of the object under examination in the magnetic resonance system. The logical coordinate system (x,y,z) may for example be selected by a user or also automatically as a function of the examination region to be examined and its position and location in the magnetic resonance system, wherein it is conceivable for the logical coordinate system to be adapted over the course of a measurement, for example after a movement of the object under examination.

The RF excitation pulses, RF refocusing pulses and gradients to be switched which the measurement protocol MP comprises provide that, after irradiation of an RF excitation pulse, a train of at least two RF refocusing pulses is irradiated and measurement data is captured after each RF refocusing pulse. The measurement protocol MP therefore specifies capture of measurement data MD by means of a TSE sequence, or at least of a TSE-like sequence.

One example of a possible sequence specified by the measurement protocol MP will be shown later with the assistance of part of a pulse sequence scheme shown diagrammatically in FIG. 2 for capturing measurement data MD, in which the loaded measurement protocol MP specifies a time frame KGT for compensation gradients KG to be determined. Such a time frame KGT for compensation gradients KG to be determined ensures that the measurement protocol has sufficient "space" (timewise) available for the compensation gradients which are to be switched, and may for example proceed straightforwardly by specification of a starting compensation gradient KG'.

As a function of the loaded measurement protocol MP and of the data GRD which characterizes the gradient unit, compensation gradients KG are determined which are to be switched after capture of measurement data MD after a final RF refocusing pulse of a train of RF refocusing pulses associated with an RF excitation pulse and before a following RF excitation pulse (block 105).

Determination of a compensation gradient may comprise a transformation of the data which characterizes the gradient unit from the physical coordinate system (X,Y,Z) of the gradient coils of the gradient unit into a logical coordinate system (x,y,z) of the measurement protocol.

Data which characterizes the gradient unit present in the physical coordinate system (X,Y,Z) may here be transformed into data present in logical coordinates (x,y,z) in accordance with the same rotation matrix R which has already been used for conversion between the coordinate systems (X,Y,Z) and (x,y,z) during the generation of all the gradients, for which the following for example applies:

$$-\begin{bmatrix} x \\ y \\ z \end{bmatrix} = \begin{bmatrix} R_{11} & R_{12} & R_{13} \\ R_{21} & R_{22} & R_{23} \\ R_{31} & R_{32} & R_{33} \end{bmatrix} \begin{bmatrix} X \\ Y \\ Z \end{bmatrix}. \quad (4)$$

Thus, the following is analogously obtained for example in the case of GIRFs as the data which characterizes the gradient unit and was measured for the physical coordinate system (X,Y,Z):

$$\begin{bmatrix} GIRF_x(t) \\ GIRF_y(t) \\ GIRF_z(t) \end{bmatrix} = \begin{bmatrix} R_{11} & R_{12} & R_{13} \\ R_{21} & R_{22} & R_{23} \\ R_{31} & R_{32} & R_{33} \end{bmatrix} \begin{bmatrix} GIRF_X(t) \\ GIRF_Y(t) \\ GIRF_Z(t) \end{bmatrix}. \quad (5)$$

Once, through such a transformation of the coordinate system, the data which characterizes the gradient unit is available in the logical coordinate system corresponding to the image to be captured, all further steps may proceed in the logical coordinate system.

Such a transformation of the coordinate system may proceed with a constantly up-to-date rotation matrix R on each determination of compensation gradients during the measurement time which is required for capturing all the desired measurement data. In this way, dynamic adaptation of compensation gradients is achieved in the event of possible changes in the location of an object under examination or of the desired location of the region under examination, and thus a possible change in the logical coordinate system and the rotation matrix R.

Determination of a compensation gradient may, for example according to one of equations (1) or (3), comprise convolution of (nominal) gradients which are to be switched and are specified by the loaded measurement protocol in a repeat time TR, in which the compensation gradient to be determined is located, with the loaded data which characterizes the gradient unit. It is conceivable for (nominal) gradients which are to be switched also to be taken into account in determining the compensation gradients before the repeat time TR in which the compensation gradient to be determined is located.

The determination of compensation gradients may be limited to the slice selection direction (z direction) and the read-out direction (x direction) in the logical coordinate system if perturbations in the phase-encoding direction (y direction) are considered negligible.

The measurement protocol may for example specify a nominal starting compensation gradient, the time profile and in particular the amplitude of which may also already be selected, for example according to a known method as a function of the nominal gradients to be switched in the measurement protocol in (and optionally before) the repeat time TR in which the compensation gradient to be determined is located. Such starting compensation gradients ($G^{nominal}$) may, as described above, be transformed into a currently valid logical coordinate system (x,y,z) and the actual gradients ($G^{actual}$) thereof ascertained by convolution with the data which characterizes the gradient unit, e.g. GIRFs, and has likewise been transformed into the logical coordinate system (x,y,z). For such nominal starting compensation gradients in the x direction and in the z direction, this gives rise, for example for GIRFs, to:

$$G_x^{actual}(t) = G_x^{nominal}(t) \otimes GIRF_x(t) \tag{6a}$$

$$G_z^{actual}(t) = G_z^{nominal}(t) \otimes GIRF_z(t). \tag{6b}$$

It should once again be mentioned that, when determining the actual gradients ($G^{actual}$), account should only be taken of nominal gradients which are to be switched before an RF excitation pulse, before which compensation gradients to be determined, although the compensation gradients only take effect timewise at the earliest from this subsequent RF excitation pulse.

Determination of a compensation gradient may take account of at least one desired point in time at which artifacts, in particular due to contributions from eddy currents should be avoided or at least reduced. Such desired points in time may be selected, for example depending on the nature of the measurement to be made, from the group of:

i) point in time of irradiation of the RF excitation pulse following the compensation gradient, ii) points in time of capture of central measurement data, and iii) if the measurement protocol comprises RF preparation pulses, such as for example RF saturation pulses, in particular RF fat saturation pulses, point in time of irradiation of an RF saturation pulse before the RF excitation pulse following the compensation gradient.

By taking account of such desired points in time, compensation gradients can be determined in a targeted manner in such a way that compensation is optimum at the desired points in time, such that an influence of eddy current effects is minimized in particular at the desired points in time.

To this end, a suitable measure which measures the influence of eddy current effects may for example be minimized for the desired points in time. For example the 2 norm, also known as the standard norm, of the actual gradients can be used as such a measure, which can be minimized iteratively, and, for example, separately for all logical axes x, y, and z concerned.

The desired points in time can furthermore be provided with a weighting. Such weighting may be achieved by way of weighting factors assigned to the desired points in time, which factors are for example selected such that desired points in time which are classed as more important for image quality are more heavily weighted than desired points in time which are classed as less important. Such weighting can on the one hand accelerate minimization, wherein it is on the other hand ensured that perturbing artifacts are avoided as efficiently as possible.

For the example used above of compensation gradients in the x direction and in the z direction and in the notation used above, such an optimization may be written:

$$\sum_i w_i |G_x^{actual}(t_i)|^2 \rightarrow \min \tag{7a}$$

$$\sum_i w_i |G_z^{actual}(t_i)|^2 \rightarrow \min, \tag{7b}$$

with $t_i$ as the desired points in time, and $w_i$ as their weighting factors.

Once the described (optionally weighted) 2 norms have been determined, the profile of the associated compensation gradients, in particular the duration, amplitude and ramps thereof, can be modified according to a known minimization method, for example according to a conjugate gradient (CG) method, and the 2 standards redetermined until a minimum is reached. Once the minimum of the measure which measures an influence of eddy current effects has been identified, the compensation gradients are determined.

In order to accelerate minimization for all the desired points in time, a compensation gradient identified as the minimum for a desired point in time can here be used as a starting compensation gradient for further desired points in time. In particular, since convolution is a linear operation and providing no other changes are made to the pulse sequence used, it is possible to adjust such a minimum compensation gradient identified for a desired point in time only by time shifts corresponding to the time distances of the further desired points in time from the desired point in time for which a compensation gradient has already been identified, in order to obtain the compensation gradients associated with the further desired points in time.

If parameters, in particular the gradients to be switched, of the measurement protocol are changed during ongoing measurement, for example due to a change in the logical coordinate system (x,y,z), the compensation gradients must be redetermined taking the change into account.

It should be noted that, for the stated data which characterizes the gradient unit, actual gradients can in each case be determined according to the equations (1) and (3) by way of convolution with the respective data which characterizes the gradient unit, wherein convolution is convolved once directly with the nominal gradients (GIRF), and once with the first time derivative of the nominal gradients (decay profiles).

While convolution of the nominal gradients with GIRFs directly leads (1) to actual gradients (which include eddy current effects), convolution of the first time derivative of the nominal gradients with the stated decay profiles yields (3) the pure perturbation produced by eddy current effects.

As stated, however, the compensation gradients should only take effect timewise at the earliest from an RF excitation pulse following the compensation gradient. At the point in time of irradiation of this subsequent RF excitation pulse, gradients to be switched in the repeat time TR before the RF excitation pulse are already switched off, whereby nominal gradients to be switched during or before a repeat time TR have the value zero from the point in time of a subsequent RF excitation pulse. In this way, by using GIRFs to determine the data which characterizes the gradient unit, equation (1) also yields the pure perturbation produced by eddy current effects for points in time when the compensation gradients should take effect, for example at desired points in time $t_i$.

Therefore, when the stated decay profiles are used for determining the data which characterizes the gradient unit, it is possible to proceed analogously to the above GIRF-based data which characterizes the gradient unit.

In particular, decay profiles present in the physical coordinate system (X,Y,Z) $\sum_k a_{k,X} e^{-t/\tau_{k,X}}$, $\sum_k a_{k,Y} e^{-t/\tau_{k,Y}}$, $\sum_k a_{k,Z} e^{-t/\tau_{k,Z}}$ may be transformed into the logical coordinate system (x,y,z) analogously to equation (5) by way of the rotation matrix:

$$\begin{bmatrix} \sum_k a_{k,x} e^{-t/\tau_{k,x}} \\ \sum_k a_{k,y} e^{-t/\tau_{k,y}} \\ \sum_k a_{k,z} e^{-t/\tau_{k,z}} \end{bmatrix} = \begin{bmatrix} R_{11} & R_{12} & R_{13} \\ R_{21} & R_{22} & R_{23} \\ R_{31} & R_{32} & R_{33} \end{bmatrix} \begin{bmatrix} \sum_k a_{k,X} e^{-t/\tau_{k,X}} \\ \sum_k a_{k,Y} e^{-t/\tau_{k,Y}} \\ \sum_k a_{k,Z} e^{-t/\tau_{k,Z}} \end{bmatrix}. \quad (8)$$

Furthermore (analogously to equations 6a and 6b in conjunction with equation 3), the perturbations in the axes of the logical coordinate system (x,y,z) caused by eddy current effects may be ascertained by convolving the first time derivative of the nominal gradients with the decay profiles present in the logical coordinate system:

$$E_x(t) = \left(\frac{d}{dt} G_x^{nominal}(t)\right) \otimes \sum_k a_{k,x} e^{-t/\tau_{k,x}} \quad (9a)$$

$$E_z(t) = \left(\frac{d}{dt} G_z^{nominal}(t)\right) \otimes \sum_k a_{k,z} e^{-t/\tau_{k,z}} \quad (9b)$$

By taking account of above-described desired points in time, compensation gradients can likewise be determined in a targeted manner in such a way that compensation is optimum at the desired points in time, such that an influence of eddy current effects is minimized in particular at the desired points in time.

To this end, a suitable measure which measures the influence of eddy current effects may be minimized for the desired points in time, wherein the desired points in time may in turn also be provided with a weighting (cf. equations 7a and 7b). The following is analogously obtained:

$$\sum_i w_i |E_x(t_i)|^2 \text{ min} \quad (10a)$$

$$\sum_i w_i |E_z(t_i)|^2 \text{ min.} \quad (10b)$$

Determination of a compensation gradient may thus comprise minimizing a measure which measures the influence of eddy current effects for desired points in time. Determination of a compensation gradient may furthermore comprise weighting of the desired points in time.

The loaded measurement protocol MP is carried out using the specific compensation gradients KG (block 107), whereby measurement data MD is captured and wherein changes in the parameters, in particular of the gradients to be switched and/or of the logical coordinate system (x,y,z), of the measurement protocol may optionally be taken into account on determination of the compensation gradients.

On the basis of the captured measurement data MD, image data BD can be reconstructed (block 109), in which artifacts are reduced by using the compensation gradients according to the disclosure.

By determining compensation gradients according to the disclosure as a function of both a loaded measurement protocol MP to be used and of system-specific data which characterizes the gradient unit, the compensation gradients determined in this way are optimized not only for the measurement protocol but also for the magnetic resonance system with its gradient unit which has been used. In this way, troublesome artifacts, in particular perturbations produced by system-specific eddy current effects, can simultaneously be optimally avoided not only in a protocol-specific manner but also in a system-specific manner.

Figure 2:
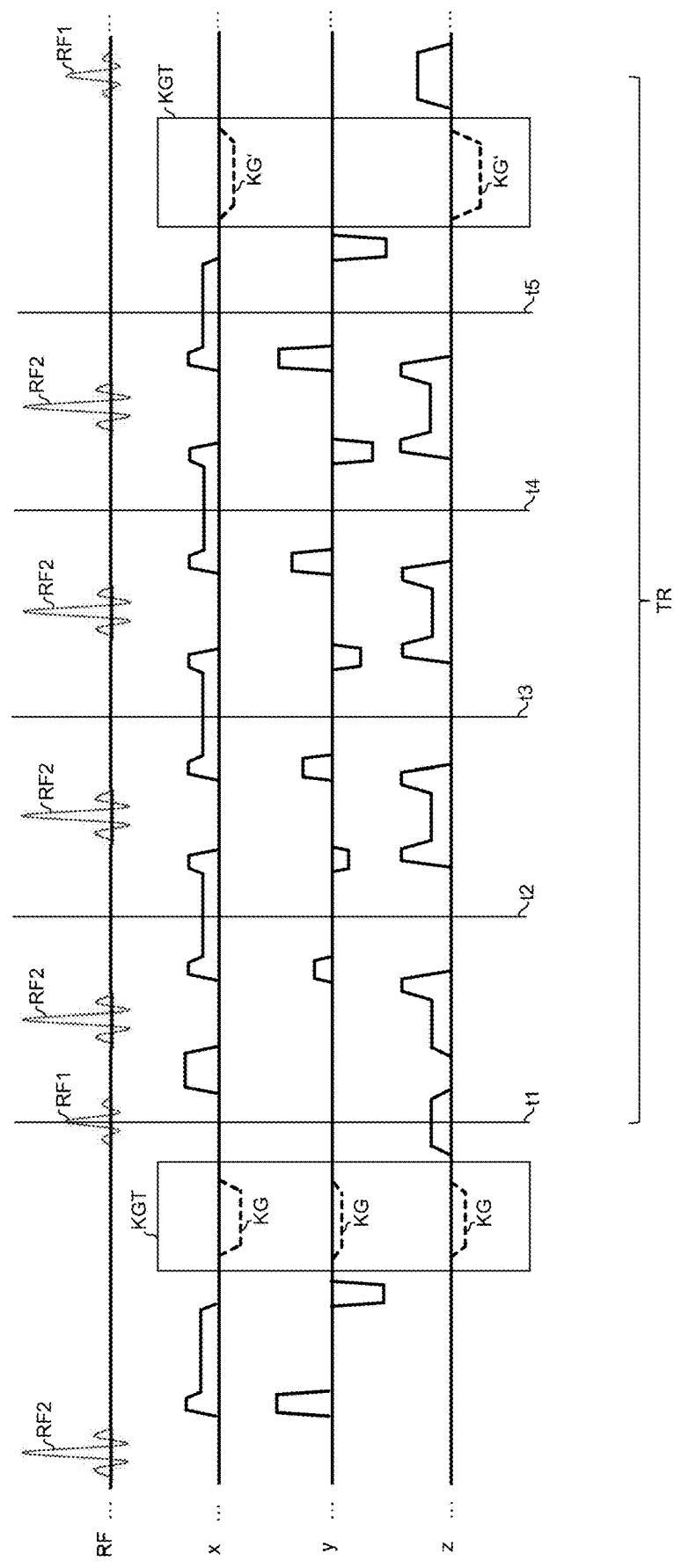
FIG. 2 shows a diagram of part of a pulse sequence scheme for capturing measurement data according to a measurement protocol having compensation gradients according to the disclosure.

FIG. 2 is a schematic representation of part of a pulse sequence scheme for capturing measurement data MD according to a measurement protocol MP with compensation gradients KG according to the disclosure in its time profile.

The top line (RF) shows the time profile of RF-pulses to be irradiated, the second line (x) shows associated gradients to be switched in the read-out direction x, the third line (y) shows associated gradients to be switched in the phase-encoding direction y and the fourth line (z) shows associated gradients to be switched in the slice selection direction.

For the purposes of illustration and in order to focus on essentials, only four RF refocusing pulses RF2 are shown in a train of RF refocusing pulses RF2 after an RF excitation pulse RF1, and thus within a repeat time TR. In fact, distinctly more RF refocusing pulses RF2 may be used in a repeat time TR after an RF excitation pulse RF1. A repeat time TR is the time span between two successive RF excitation pulses RF1, in which a train of at least two, in this case four, RF refocusing pulses RF2 is irradiated, after which measurement data is in each case captured.

The illustrated pulse sequence scheme of the loaded measurement protocol MP, in each case after a final read-out process in which measurement data is captured, specifies, in a repeat time TR, a time frame KGT for compensation gradients KG to be determined, which may in principle be located on all the logical axes, thus all the directions x, y, and z. Compensation gradients KG according to the disclosure, as shown in dashed lines in the left-hand time frame KGT, were, for example, determined. In the next repeat time TR (which can be seen in its entirety in FIG. 2), two starting compensation gradients KG' in the read-out direction x and the slice selection direction z are shown which are located in the specified time frame KGT of this repeat time TR, and which are exemplary starting values as may be used for determining compensation gradients according to the disclosure.

Possible desired points in time at which artifacts, in particular due to contributions from eddy currents, are to be avoided or at least reduced, are indicated by the vertical lines t1, t2, t3, t4 and t5. In the example of FIG. 2, point in time t1 is the point in time of irradiation of the RF excitation pulse RF1 following the compensation gradients KG, and points in time t2 to t5 are successive points in time of capture of central measurement data MD after each of the RF refocusing pulses RF2 of the train of RF refocusing pulses after the RF excitation pulse RF1 which follows the compensation gradients KG.

Figure 3:
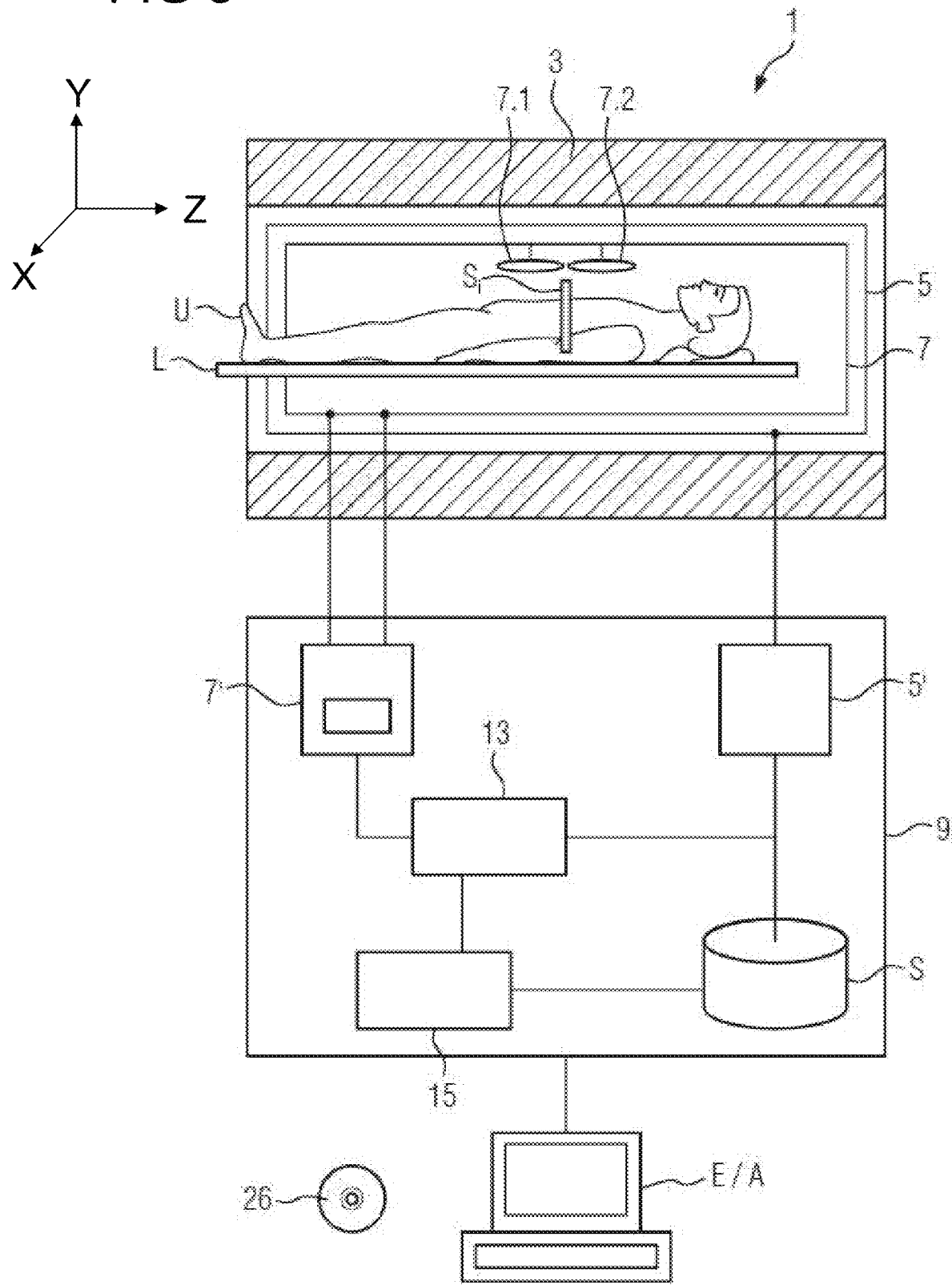
FIG. 3 shows a diagram of a magnetic resonance system according to the disclosure.

FIG. 3 is a schematic diagram of a magnetic resonance system 1 according to the disclosure. This comprises a magnet unit 3 for generating the main magnetic field, a gradient unit 5 for generating the gradient fields, a radio-frequency unit 7 for irradiating and receiving radio-frequency signals and a control device 9 configured to carry out a method according to the disclosure. The magnetic resonance system is located in a physical coordinate system X,Y,Z, wherein the Z axis is typically located in the longitudinal axis of the magnet unit 3 and the gradient unit 5. The gradient unit typically comprises gradient coils for generating gradient fields, each acting in one of the three physical axis directions X, Y and Z.

FIG. 3 is merely a rough diagrammatic representation of these subunits of the magnetic resonance system 1. In particular, the radio-frequency unit 7 may consist of a plurality of subunits, for example of a plurality of coils like the diagrammatically represented coils 7.1 and 7.2 or more coils, which may be designed either only for transmitting radio-frequency signals or only for receiving the triggered radio-frequency signals or for both.

In order to examine an object under examination U, for example a patient or also a phantom, this can be introduced on a couch L into the measuring volume of the magnetic resonance system 1. The slice or slab Si is an exemplary target volume of the object under examination from which echo signals are to be captured and acquired as measurement data.

The control device 9 serves to control the magnetic resonance system 1 and can in particular control the gradient unit 5 by means of a gradient controller 5' and the radio-frequency unit 7 by means of a radio-frequency transmit/receive controller 7'. The radio-frequency unit 7 may here comprise a plurality of channels on which signals can be transmitted or received.

The radio-frequency unit 7, together with its radio-frequency transmit/receive controller 7', is responsible for generating and irradiating (transmitting) a radio-frequency alternating magnetic field for manipulating spins in a region to be manipulated (for example in slices S to be measured) of the object under examination U. The center frequency of the radio-frequency alternating magnetic field, which is also known as the B1 field, is usually set such that it is as close as possible to the resonant frequency of the spins to be manipulated. Deviations of the center frequency from the resonant frequency are known as off-resonance. The radio-frequency transmit/receive controller 7' in the radio-frequency unit 7 applies controlled currents to the RF coils in order to generate the B1 field.

The control device 9 furthermore comprises a compensation gradient determination unit 15 with which compensation gradients according to the disclosure can be determined for avoiding artifacts, in particular for compensating eddy currents, which gradients can be implemented by the gradient controller 5'. The control device 9 is configured overall to carry out a method according to the disclosure.

A computing unit 13 included in the control device 9 is configured to carry out all the computing operations necessary for the required measurements and determinations. Intermediate and final results required or ascertained for this purpose can be stored in a memory unit S of the control device 9. The illustrated units should not necessarily be understood as physically separate units, but merely represent a subdivision into units of meaning which may, however, also be embodied in fewer or even just one single physical unit.

Control commands can be sent, for example by a user, to the magnetic resonance system and/or results from the control device 9, for example in the form of image data, can be displayed via an input/output device E/A of the magnetic resonance system 1.

A method described herein may also take the form of a computer program product which comprises a program and implements the described method on a control device 9 when it is executed on the control device 9. Likewise, an electronically readable data storage medium 26 with electronically readable control information stored thereon may be present, which control information comprises at least one such computer program product as has just been described and is designed to carry out the described method in a control device 9 of a magnetic resonance system 1 using the data storage medium 26.

The invention claimed is:

1. A method for avoiding artifacts in measurement data captured using a magnetic resonance system which includes a gradient unit, the method comprising:
    loading data which characterizes the gradient unit of the magnetic resonance system;
    loading a measurement protocol to be used for capturing the measurement data, wherein the measurement protocol includes gradients to be switched and radio frequency (RF) excitation pulses and RF refocusing pulses to be irradiated,
    wherein, after irradiation of an RF excitation pulse, a train of at least two RF refocusing pulses is irradiated, and the measurement data is captured after each RF refocusing pulse; and
    determining compensation gradients which, after the capture of the measurement data, are to be switched after a final RF refocusing pulse of the train of RF refocusing pulses associated with the RF excitation pulse and before a following RF excitation pulse as a function of the measurement protocol and of the data which characterizes the gradient unit; and
    carrying out the measurement protocol using the compensation gradients.

2. A magnetic resonance system comprising a magnet unit, a gradient unit, a radio-frequency unit and a control device with a radio-frequency transmit/receive controller and having a compensation gradient determination unit, wherein the control device is configured to carry out a method on the magnetic resonance system, wherein the method is for avoiding artifacts in measurement data captured using the magnetic resonance system and comprises:
    loading data which characterizes the gradient unit of the magnetic resonance system;
    loading a measurement protocol to be used for capturing the measurement data, wherein the measurement protocol includes gradients to be switched and radio frequency (RF) excitation pulses and RF refocusing pulses to be irradiated,
    wherein, after irradiation of an RF excitation pulse, a train of at least two RF refocusing pulses is irradiated, and the measurement data is captured after each RF refocusing pulse; and
    determining compensation gradients which, after the capture of the measurement data, are to be switched after a final RF refocusing pulse of the train of RF refocusing pulses associated with the RF excitation pulse and before a following RF excitation pulse as a function of the measurement protocol and of the data which characterizes the gradient unit; and
    carrying out the measurement protocol using the compensation gradients.

3. The method as claimed in claim 1, wherein the gradient unit comprises at least three gradient coils, and the data which characterizes the gradient unit is loaded for each of the gradient coils included in the gradient unit.

4. The method as claimed in claim 1, wherein the determination of the compensation gradients comprises a transformation of the data which characterizes the gradient unit from a physical coordinate system of the gradient coils of the gradient unit into a logical coordinate system of the measurement protocol.

5. The method as claimed in claim 1, wherein the determination of the compensation gradients comprises convolution of gradients which are to be switched and are specified by the measurement protocol in the train of RF refocusing pulses preceding the compensation gradient with the data which characterizes the gradient unit.

6. The method as claimed in claim 1, wherein the data which characterizes the gradient unit characterizes an eddy current characteristic of the gradient unit.

7. The method as claimed in claim 1, wherein the measurement protocol specifies a time frame for compensation gradients to be determined.

8. The method as claimed in claim 1, wherein the data which characterizes the gradient unit is measured once on the magnetic resonance system.

9. The method as claimed in claim 1, wherein the data which characterizes the gradient unit is based on measured gradient impulse response functions.

10. The method as claimed in claim 1, wherein the data which characterizes the gradient unit is determined on the basis of a model which comprises measured decay profiles of the gradient unit.

11. A non-transitory electronically readable data storage medium having electronically readable control information stored thereon, which comprises at least one computer program and is designed such that, when the data storage medium is used in a control device of a magnetic resonance system, the information carries out the method as claimed in claim 1.

12. The method as claimed in claim 1, wherein an earliest time the determined compensation gradients take effect is from a subsequent RF excitation pulse.

13. The method as claimed in claim 6, wherein the determination of the compensation gradients takes into account at least one point in time at which contributions from eddy currents are to be avoided or at least reduced, wherein the at least one point in time is selected from a group consisting of:
   i) point in time of irradiation of the RF excitation pulse following the compensation gradients,
   ii) points in time of capture of central measurement data, and
   iii), if the measurement protocol comprises RF saturation pulses, point in time of irradiation of an RF saturation pulse before the RF excitation pulse following the compensation gradients.

14. The method as claimed in claim 13, wherein the determination of the compensation gradient comprises minimizing a measure of an influence of eddy current effects for the at least one point in time.

15. The method as claimed in claim 9, wherein the measured gradient impulse response functions have been measured on the magnetic resonance system for a series of low frequencies located within a half-value width of a spectral density-frequency diagram, for frequencies of less than 10 kHz.

* * * * *